US009870436B2

(12) United States Patent
Lorono et al.

(10) Patent No.: US 9,870,436 B2
(45) Date of Patent: Jan. 16, 2018

(54) CREATING A BROKEN REPRESENTATION OF A COMPUTER-AIDED DESIGN MODEL

(71) Applicant: Dassault Systemes SolidWorks Corporation, Waltham, MA (US)

(72) Inventors: Matthew Lorono, Bolton, MA (US); Robert Siegel, Lexington, MA (US); Sachin Darwatkar, Pune (IN); Rupesh Kumar, Pune (IN)

(73) Assignee: Dassault Systemes SolidWorks Corporation, Waltham, MA (US)

( * ) Notice: Subject to any disclaimer, the term of this patent is extended or adjusted under 35 U.S.C. 154(b) by 470 days.

(21) Appl. No.: 14/604,354

(22) Filed: Jan. 23, 2015

(65) Prior Publication Data

US 2015/0213156 A1 Jul. 30, 2015

Related U.S. Application Data

(60) Provisional application No. 61/931,497, filed on Jan. 24, 2014.

(51) Int. Cl.
*G06F 17/50* (2006.01)
*G06T 17/00* (2006.01)
*G06T 19/20* (2011.01)

(52) U.S. Cl.
CPC .............. *G06F 17/50* (2013.01); *G06T 17/00* (2013.01); *G06T 19/20* (2013.01);
(Continued)

(58) Field of Classification Search
CPC ......... G06T 17/20; G06T 19/00; G06T 17/00; G06T 17/10; G06T 17/005
See application file for complete search history.

(56) References Cited

U.S. PATENT DOCUMENTS

2002/0089499 A1* 7/2002 Lee ........................ G06T 17/005
345/419
2008/0036761 A1* 2/2008 Mazzanti ................ G06T 19/20
345/420
(Continued)

FOREIGN PATENT DOCUMENTS

WO WO 2015/112880 A1 7/2015

OTHER PUBLICATIONS

International Preliminary Report on Patentability for International Application No. PCT/US2015/012718, "Creating a Broken Representation of a Computer-Aided Design Model," dated Jul. 26, 2016.
(Continued)

*Primary Examiner* — Todd Buttram
(74) *Attorney, Agent, or Firm* — Hamilton, Brook, Smith & Reynolds, P.C.

(57) ABSTRACT

A computer-implemented method and system create computer-generated three-dimensional (3D) models in a broken state (broken view representation). To create a 3D model in a broken state, an area of the 3D model in an unbroken state is removed to create the 3D model in the broken state and a mapping between the 3D model in the unbroken state and the 3D model in a broken state is implemented to enable operations performed on the 3D model in the broken state to utilize data defining the 3D model in the unbroken state. The mapping maintains a relationship between data defining the 3D model in the unbroken state and data defining the 3D model in the broken state.

19 Claims, 11 Drawing Sheets

(52) U.S. Cl.
CPC .. *G06T 2219/004* (2013.01); *G06T 2219/012* (2013.01); *G06T 2219/2008* (2013.01)

(56) References Cited

U.S. PATENT DOCUMENTS

2013/0262066 A1\* 10/2013 Erdim ................. G06F 17/5086
 703/7
2014/0081604 A1\* 3/2014 Chow ..................... G06F 17/50
 703/1

OTHER PUBLICATIONS

Solidworks Simulation (SolidWorks Simulation get Engineering Insights With Virtual Simulation, Dassault Systemes, pp. 1-6, Nov. 2014).
Solidworks Premium (SolidWorks Premium Inspiring Innovation, Dassault Systemes, pp. 1-8, Nov. 2014).
Break Views (CATIA: Generative Drafting, ASCENT—Center for Technical Knowledge, 2011).
PTC International Search Report and Written Opinion (International Searching Authority, PCT/US2015/012718, dated May 2015).

\* cited by examiner

CREATING A BROKEN REPRESENTATION OF A COMPUTER-AIDED DESIGN MODEL

RELATED APPLICATION(S)

This application claims the benefit of U.S. Provisional Application No. 61/931,497, filed on Jan. 24, 2014. The entire teachings of the above application(s) are incorporated herein by reference.

BACKGROUND OF THE INVENTION

Computer-aided design (CAD) software allows a user to construct and manipulate complex three-dimensional (3D) models. A number of different modeling techniques can be used to create a 3D model. These techniques include solid modeling, wire-frame modeling, and surface modeling. Solid modeling techniques provide for topological 3D models, where the 3D model is a collection of interconnected topological entities (e.g., vertices, edges, and faces). The topological entities have corresponding supporting geometrical entities (e.g., points, trimmed curves, and trimmed surfaces). The trimmed surfaces correspond to the topological faces bounded by the edges. Wire-frame modeling techniques, on the other hand, can be used to represent a model as a collection of simple 3D lines, whereas surface modeling can be used to represent a model as a collection of exterior surfaces. CAD systems may combine these and other modeling techniques, such as parametric modeling techniques. Parametric modeling techniques can be used to define various parameters for different features and components of a model, and to define relationships between those features and components based on relationships between the various parameters.

CAD systems may also support two-dimensional (2D) objects that are 2D representations of 3D objects. Two- and three-dimensional objects are useful during different stages of a design process. Three-dimensional representations of a model are commonly used to visualize a model in a physical context because the designer can manipulate the model in 3D space and can visualize the model from any conceivable viewpoint. Two-dimensional representations of a model are commonly used to prepare and formally document the design of a model.

A design engineer is a typical user of a 3D CAD system. The design engineer designs physical and aesthetic aspects of 3D models, and is skilled in 3D modeling techniques. The design engineer creates parts and may assemble the parts into a subassembly. A subassembly may also consist of other subassemblies. An assembly is designed using parts and subassemblies. Parts and subassemblies are hereinafter collectively referred to as components.

In some cases a user may wish to create a broken view of a 2D CAD model. Broken views make it possible to display a drawing view in a larger scale on a smaller size drawing sheet by removing from the view sections of the model that are redundant or in some way deemed unnecessary to the view. The design engineer creates a gap or break in the view using a pair of break lines. Reference dimensions and model dimensions associated with the broken area should reflect the actual model values.

In current state-of-the-art computer-aided-design systems, broken views in a feature-based 3D model may be created by adding features directly to the 3D model. These features do not preserve the 3D model in its unbroken state, so to query and annotate the 3D model, the interruption features must be removed. Moreover, if dimensions are required in the broken state, the values for the dimensions must be overwritten to display the proper value.

For example, to add a break to a 3D model using SolidWorks 2014 software, available from Dassault Systemes SolidWorks Corporation of Waltham, Mass., the user first adds a cut feature to the area to be removed within a 3D solid model, which leaves a large gap in the 3D model, with new separate solid bodies on each side of the gap. In the case of a straight cut, the user has the ability to slice a solid body with a plane. For more complex cuts, the user must first create a cutting tool body by creating a ziz-zag profile or other profile then use a SolidWorks command such as Cut-Extrude to generate the cut. The user then calculates the distance necessary to move each body equidistantly towards each other. Upon user selection of the Move/Copy Bodies command, a move body operation is then applied twice, one for each of the two bodies, thereby moving the two bodies closer together as previously calculated and also further modifying the definition of each of the solid bodies. Once this is complete, the measure tool no longer correctly measures the 3D model and dimensions are no longer correct since the 3D model was directly changed into two separate and distinct solid bodies to achieve the broken model result. Moreover, some state-of-the-art CAD systems are unable to produce accurate axonometric views that include one or more breaks in a 3D model included in a 2D drawing.

Time-saving advantages can be obtained by maintaining and assuring the accuracy and consistency of the data in a broken 3D model and the same 3D model in an unbroken state enabling users to (a) quickly generate broken 3D models according to industry standards and applying the industry standards to views of the 3D models within respective 2D drawings, (b) interact with the broken 3D models, (c) easily modify the broken 3D models, and (d) measure and annotate the broken 3D models.

Often, modifying particular portions of a 3D model when displaying the entire or a large portion of the 3D model makes such modifications cumbersome and inefficient due to the scale at which the 3D model needs to be displayed. To increase productivity, current state-of-the-art CAD systems would benefit from a system and method for providing an abbreviated rendering of a 3D model thereby allowing a user to easily modify particular portions of the 3D model.

SUMMARY OF THE INVENTION

In general, in one aspect, embodiments of the invention feature a computer-implemented method for creating a computer-generated three-dimensional (3D) model in a broken state. To create the 3D model in a broken state, an area of 3D model in an unbroken state is removed and a mapping is implemented between the 3D model in the unbroken state and the 3D model in a broken state to enable operations performed on the 3D model in the broken state to utilize data defining the 3D model in the unbroken state. The mapping maintains a relationship between data defining the 3D model in the unbroken state and data defining the 3D model in the broken state.

Embodiments of the present invention include updating the 3D model in the unbroken state to reflect a change made to the 3D model in the broken state and updating the 3D model in the broken state to reflect a modification made to the 3D model in the unbroken state, and identifying entities in 3D model in the unbroken state using identifying data, where each identified entity is a topological entity or a geometric entity, constructing at least one data structure defining the 3D model in the unbroken state and the 3D model in the broken state, and utilizing the identifying data to determine from which identified entity in the 3D model in the unbroken state an entity in the 3D model in the broken state is derived to enable an operation performed on the 3D model in the broken state to use data defining the 3D model in the unbroken state.

In further embodiments of the present invention, the identifying data are a set of pointers between the identified entities in the 3D model in the unbroken state and respective derived entities in the 3D model in the broken state, the mapping forms a relationship between each identified entity in the 3D model in the unbroken state and a respective derived entity in the 3D model in the broken state, and the operation performed outputs a dimension or a measurement on a computer screen.

Another embodiment of the present invention includes utilizing the identifying data to determine a location associated with the 3D model in the unbroken state and computing another location in the 3D model in the broken state to display an annotation. In yet another embodiment, removing the area of the 3D model in the unbroken state includes specifying the area of the 3D model in the unbroken state to remove, constructing a volume the size of the area, and subtracting the volume from the 3D model in the unbroken state to create the 3D model in the broken state. Embodiments may construct the volume from an extruded plane, an extruded profile, or a swept profile, or by extruding a saddle-shaped surface or a zig-zag pattern surface.

Yet other embodiments may include copying the identifying data from the unbroken 3D model to a respective topological or geometric entity in the broken 3D model, and using a pointer as a reference to a topological or geometric entity in the unbroken model from the respective topological or geometric entity in the broken 3D model.

Other embodiments include a computer-aided design (CAD) system having a processor operatively coupled to a data storage system and a data storage memory operatively coupled to the processor. In such embodiments, the data storage system stores a three-dimensional (3D) model, and the data storage memory comprises instructions to configure the processor to remove an area of 3D model in an unbroken state and implement a mapping between the 3D model in the unbroken state and the 3D model in a broken state to enable operations performed on the 3D model in the broken state to utilize data defining the 3D model in the unbroken state. The mapping maintains a relationship between data defining the 3D model in the unbroken state and data defining the 3D model in the broken state.

Yet other embodiments include a computer-readable data storage medium containing instructions for removing an area of 3D model in an unbroken state and implementing a mapping between the 3D model in the unbroken state and the 3D model in a broken state to enable operations performed on the 3D model in the broken state to utilize data defining the 3D model in the unbroken state. The mapping maintains a relationship between data defining the 3D model in the unbroken state and data defining the 3D model in the broken state.

The details of one or more embodiments of the invention are set forth in the accompanying drawings and the description that follows. Other features, objects, and advantages of the invention will be apparent from the description and drawings, and from the claims.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

The patent or application file contains at least one drawing executed in color. Copies of this patent or patent application publication with color drawing(s) will be provided by the Office upon request and payment of the necessary fee.

DETAILED DESCRIPTION OF THE INVENTION

Figure 1:
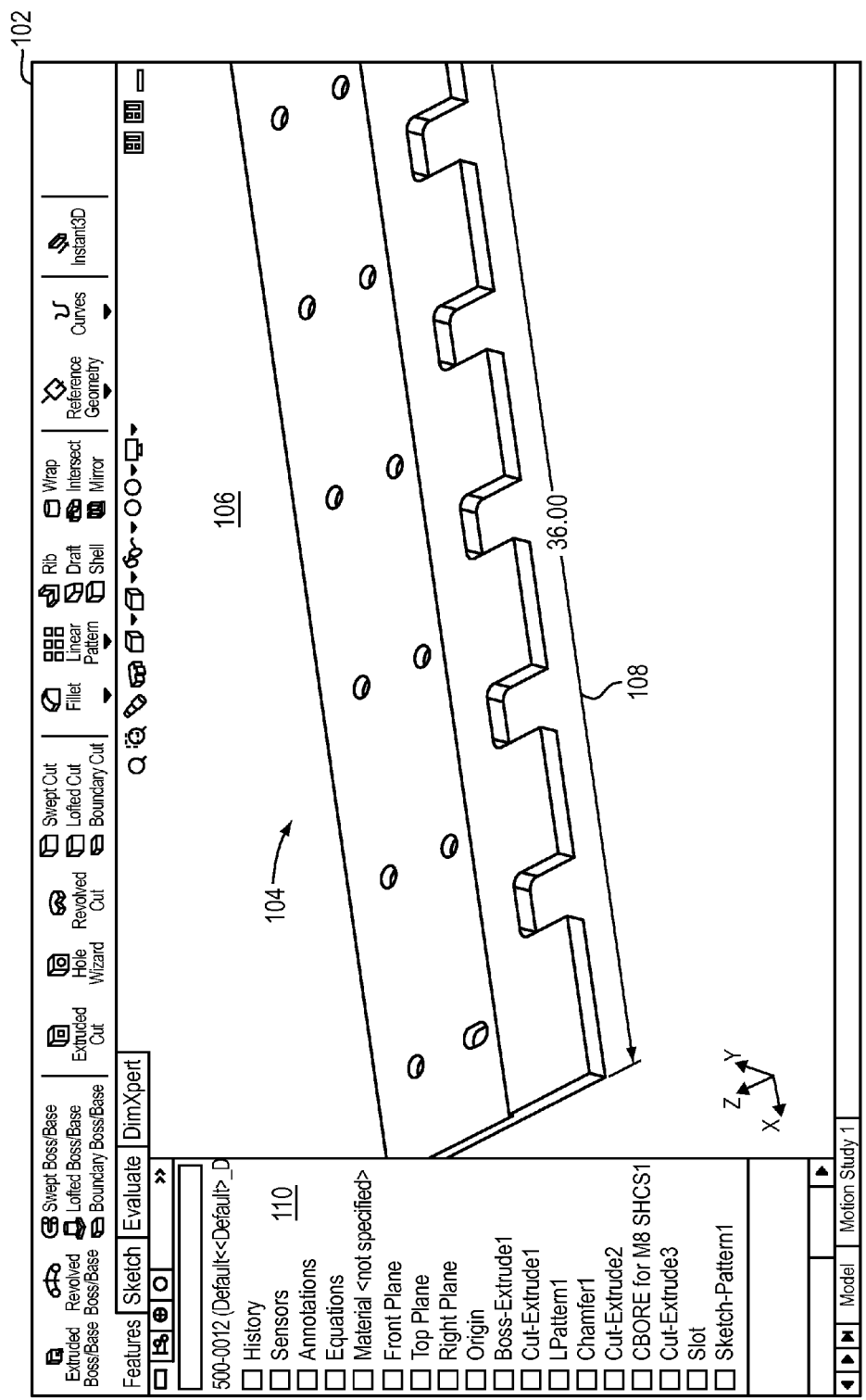
FIG. 1 is an illustration of a computer-aided design (CAD) model with a dimension.

The present invention allows for the creation of a three-dimensional (3D) computer-aided design (CAD) model that is broken in two or more pieces to eliminate the display of components or portions thereof in the broken area and make the 3D model more compact, akin to what is known by those skilled in the art as a two-dimensional (2D) broken view. The compacting of the 3D model (e.g., shortening elongated components and/or not displaying components in the resulting gap) is accurately depicted in the 3D broken state. Furthermore, the 3D broken model may be modified and the unbroken model automatically modified accordingly, and vice versa. To modify both the broken and unbroken states of the 3D model in harmony, the present invention maintains a relationship between the 3D model in an unbroken state and the same 3D model in a broken state. Maintaining the relationship enables operations performed on an unbroken model to be performed on the broken model, and vice versa. Moreover, the 3D geometry that traverses the break in the 3D model may be measured as though the 3D geometry is uninterrupted. Annotations that provide dimensional data for the traversing 3D geometry also depict values as though the 3D geometry is uninterrupted.

During the creation of the broken model, the present invention constructs data structures that map the model topology (i.e., faces, edges, etc.) in the broken model to that of the original, unbroken model. Alternatively or in addition to, geometry in the broken model may be mapped to that of the unbroken model. Certain locations in the broken and unbroken models are also mapped to one another. These locations are points where the (x,y,z) coordinates of a point is not attached to topology such as a vertex. This is the case with dimensions and measurements, for example. For instance, a dimension in addition to having references to topology also has text, witness lines, arrows, etc. A measurement as generated by SolidWorks software typically has at least an arrow and a callout box.

Mapping locations is necessary because when a model is broken the pieces move toward each other. For example, if a 3D model is broken in two, the piece of the model on the left side of the break is moved right toward the piece of the broken model on the right side of the break; and the piece of the broken model on the right side of the break is moved left toward the piece of the model on the left side of the break. (Although, an embodiment may only move one piece toward another piece that remains stationary.)

When a location in the broken model cannot be derived directly from the transformed topology, the (x,y,z) coordinates of the location are transformed from the unbroken model to the broken model or vice versa. The mapping between locations in the unbroken model and the broken model is done as follows. To map an (x,y,z) location from the unbroken model space, the present invention determines on which side of the cutting planes the location lies. From that, a vector is determined that defines the direction and magnitude by which that location will be moved. This is the same vector that is used to move the cut body pieces toward the center of the original model. If there are multiple cuts, then this process is repeated for each cut.

These mappings of locations, topology, and/or geometry enable the selection and highlighting of geometry (e.g., geometry corresponding to faces and edges) in the broken model, the display and modification of dimensions annotating the broken model, and the ability to make measurements in the broken model as though the broken model was unbroken. Moreover, the unbroken model is updated with any changes made to the broken model, as well as the broken model being updated with any changes made to the unbroken model.

Referring now to FIG. 1, a window 102 displayed on a computer monitor is shown. The window 102 is generated by modeling software executed by a computerized modeling system, an example of which is later shown with reference to FIG. 10. The window 102 is a conventional computer-generated window that can be programmed by one of ordinary skill in the art using conventional, commercially available, software programming tools, such as those available from Microsoft Corporation of Redmond, Wash.

A computer-generated 3D model 104 is displayed within a modeling portion 106 of the window 102. The surfaces of the 3D model 104 can be displayed, or the 3D model 104 can be displayed using solid lines and dashed lines to show visible edges and hidden edges, respectively, of the 3D model. A dimension 108 is displayed providing annotation that indicates the length of the model 104 is 36 units. To help the user visualize and manipulate the 3D model 104, implementations of the present invention may also include other window areas, such as a FeatureManager® window panel 110 in which the structure of a component, an assembly, or a drawing is listed.

Figure 2:
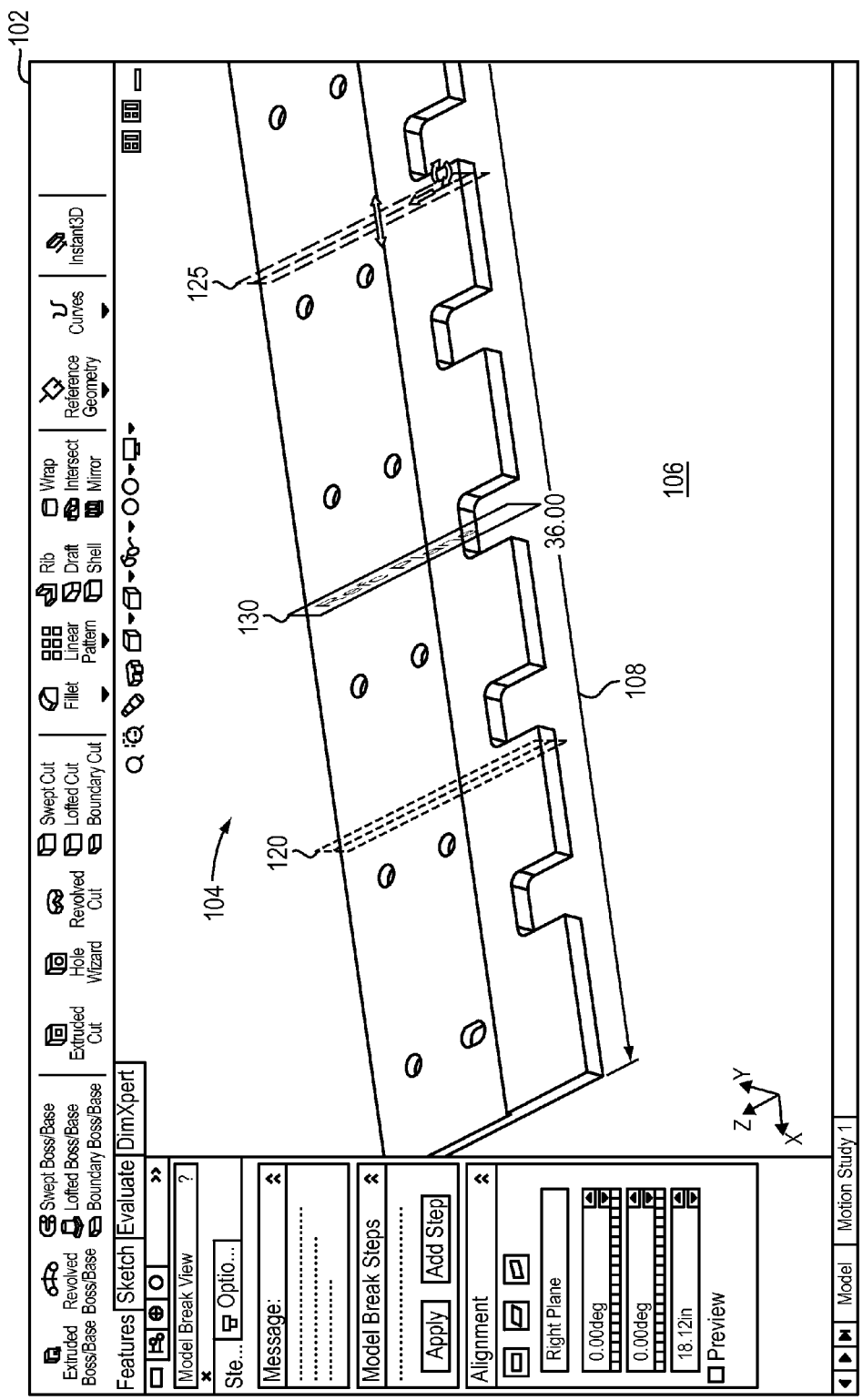
FIG. 2 is an illustration of the CAD model in FIG. 1 with cutting planes.

FIG. 2 illustrates the beginning of a process that breaks the 3D model 104 in two. As illustrated, cutting planes 120, 125 are positioned to indicate where the 3D model 104 will be broken. The cutting planes may be positioned in any direction, although all cutting planes are generally positioned in the same direction. A user interface tool may be available to position the cutting planes. In FIG. 2, the left cutting plane 120 and right cutting plane 125 can be slid across the 3D model 104 to specify the size of the gap in the 3D model 104 that will result when the 3D model 104 is broken. The area of the model 104 between the left cutting plane 120 and right cutting plane 125 will be removed to create a broken rendering of the model 104, which can be displayed in two or three dimensions.

A reference plane 130 is initially selected and determines the orientation of the left cutting plane 120 and right cutting plane 125. The left cutting plane 120 and right cutting plane 125 may be moved any distance away from the reference plane 130 independently of one another and independently of the reference plane 130, which remains stationary. The reference plane 130 may be changed and other options selected, such as an edge, an axis, a planar face, and a cylindrical face.

Figure 3:
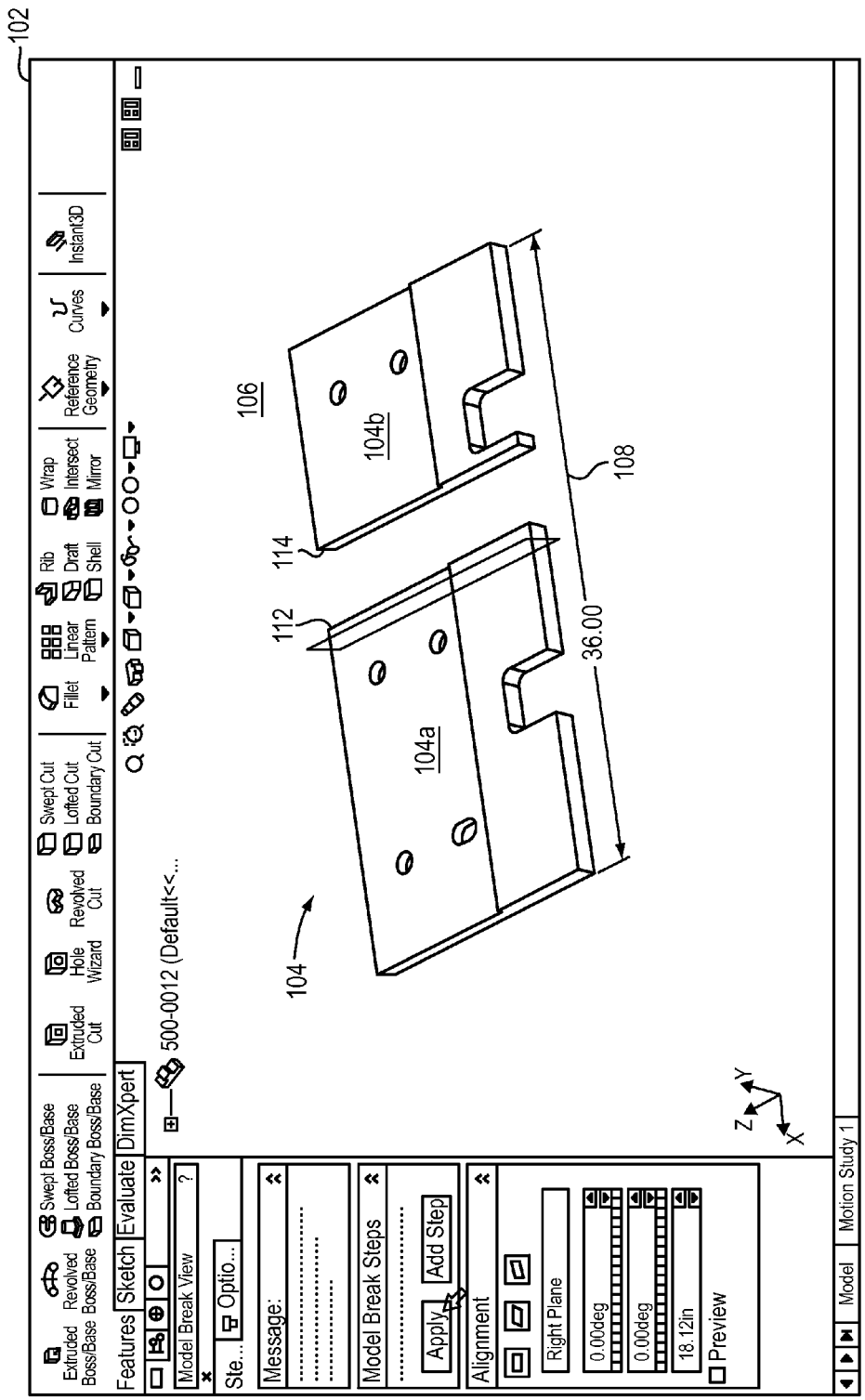
FIG. 3 is an illustration of a broken view of the CAD model in FIG. 1, according to an embodiment of the present invention.

FIG. 3 illustrates a three-dimensional broken rendering of 3D model 104 whereby the 3D model 104 is broken in two pieces 104a, 104b at the locations indicated by the left cutting plane 120 and the right cutting plane 125 shown in FIG. 2. As shown in FIG. 3, the break in the 3D model 104 is manifested by two straight cuts 112, 114. Further, the present invention maintains the relationship of the unbroken and broken models such that dimension 108 appears in the broken state of model 104 with the same value (i.e., 36) as in the unbroken state.

Figure 4:
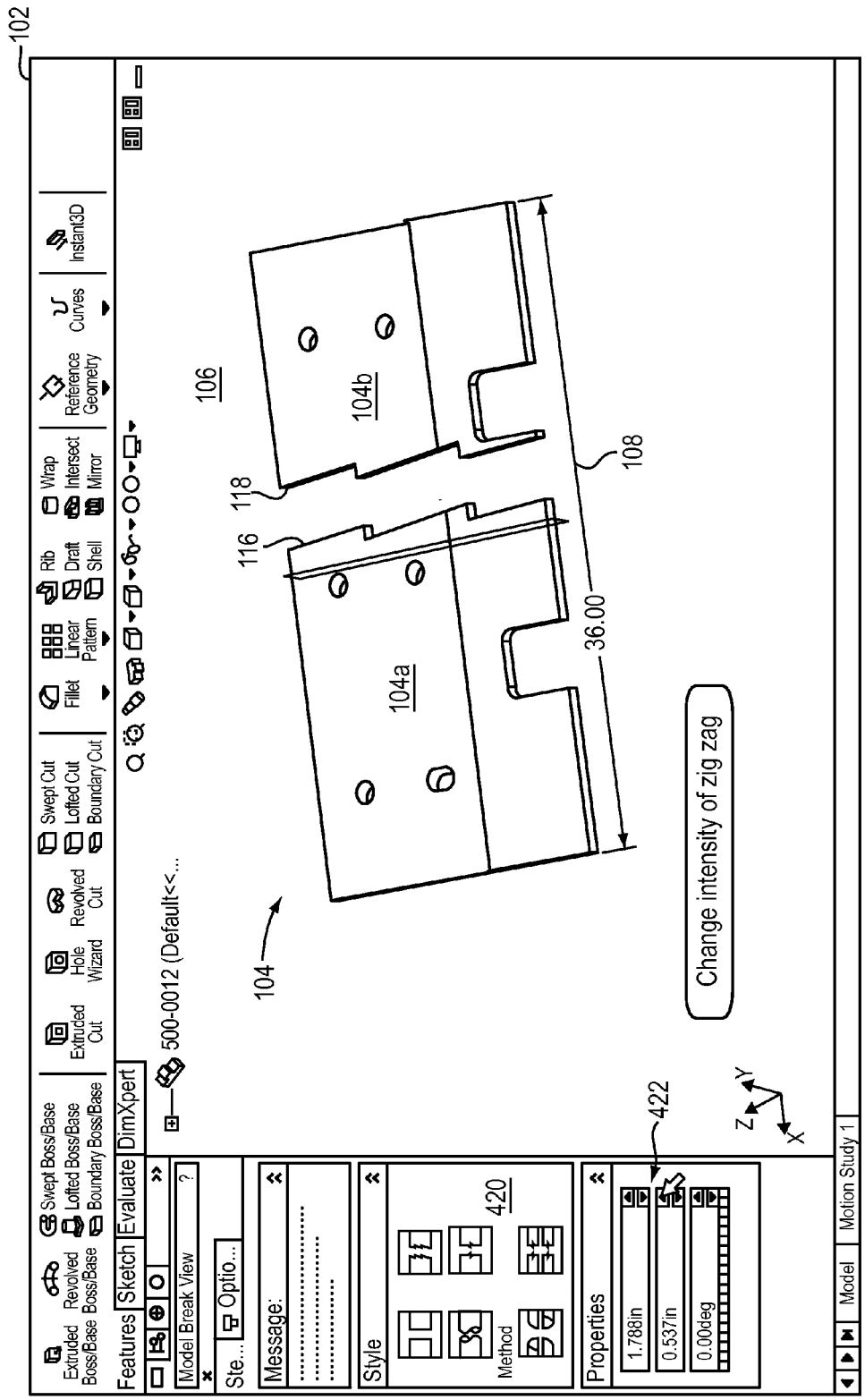
FIG. 4 is an illustration of the broken view of the CAD model in FIG. 1, according to an embodiment of the present invention.

Referring now to FIG. 4, the break in model 104 is manifested by two jagged cuts 116, 118 each forming a zig-zag pattern. The user may choose the style in which the cuts are displayed. In window 102, a user interface area 420 presents the style choices to the user, from which the user may make a selection. Style choices include straight, jagged, and saddle surface. Additionally, the user may specify properties from the properties user interface tool 422, such as the size of the gap between the broken pieces of the 3D model 104 and the angle of the jagged cuts. Other properties that may be specified include the size of the removed region if the user decides to specify the distance numerically instead of dragging the cutting planes, selection of geometry to establish the orientation of the cut orientation, for example, parallel to selected planes or perpendicular to selected edges (the default orientation is one of the three standard orthographic planes and determined by the longest dimension of the model), angle of the cuts, and size of the cut shapes. The user may specify an angle for the cutting planes and define a rotation of the cut about an axis in the plane of the screen, which is useful for the more complex cuts. The size of the cut shapes defines the angles of a zig-zag cut or the amount of curvature of a saddle cut.

Figure 5:
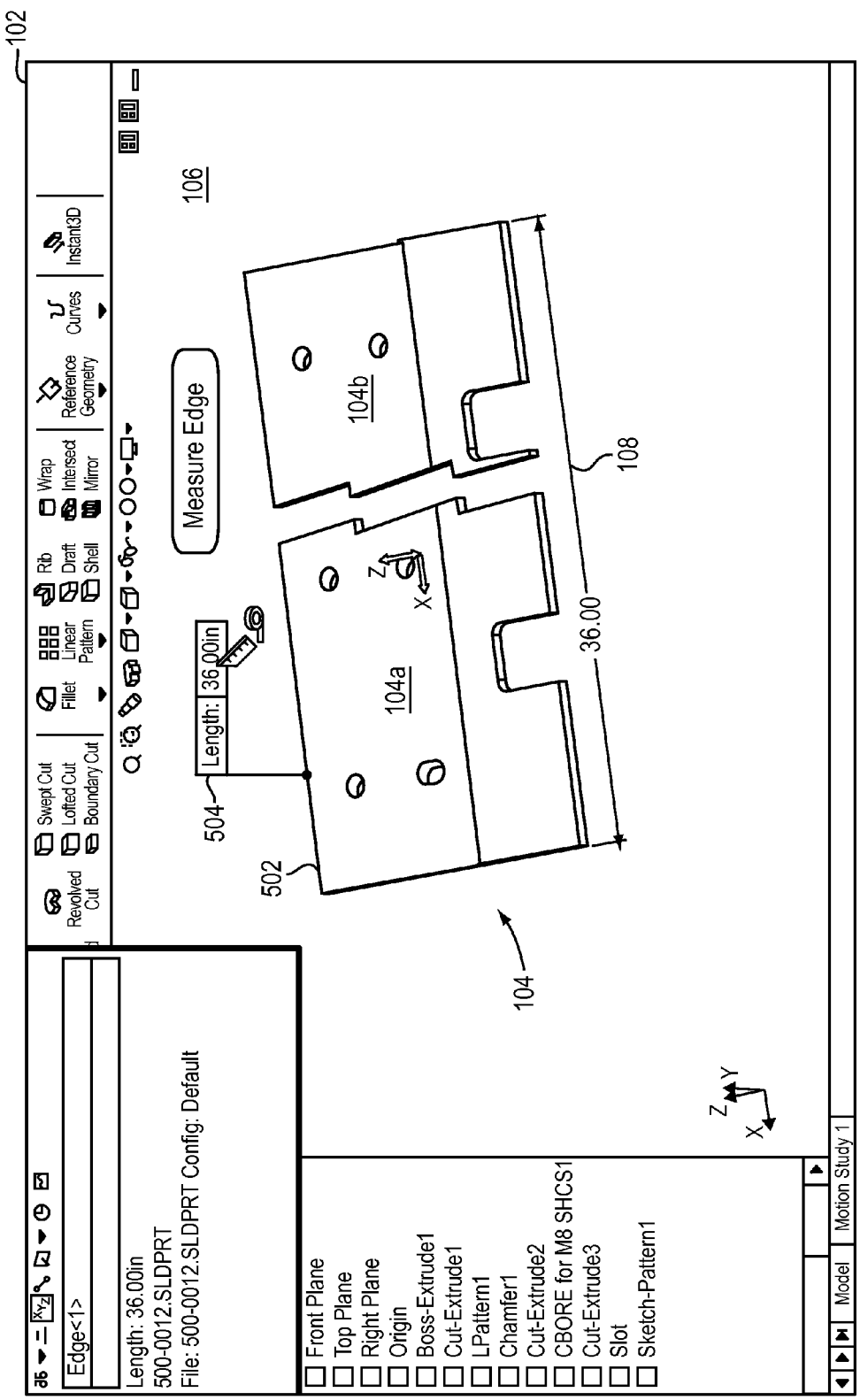
FIG. 5 is an illustration of the broken view of the CAD model in FIG. 1 and a measurement, according to an embodiment of the present invention.

Referring now to FIG. 5, a top broken edge 502 is being measured and a callout 504 informs the user that the length of the top broken edge 502 is 36 units, which is the same value as the value associated with dimension 108 in the unbroken 3D model 104 shown in FIGS. 1 and 2 and in the broken 3D model 104 shown in FIGS. 3 and 4. The entire top broken edge 502 of 3D model 104 was measured as if the top broken edge 504 was unbroken.

Figure 6:
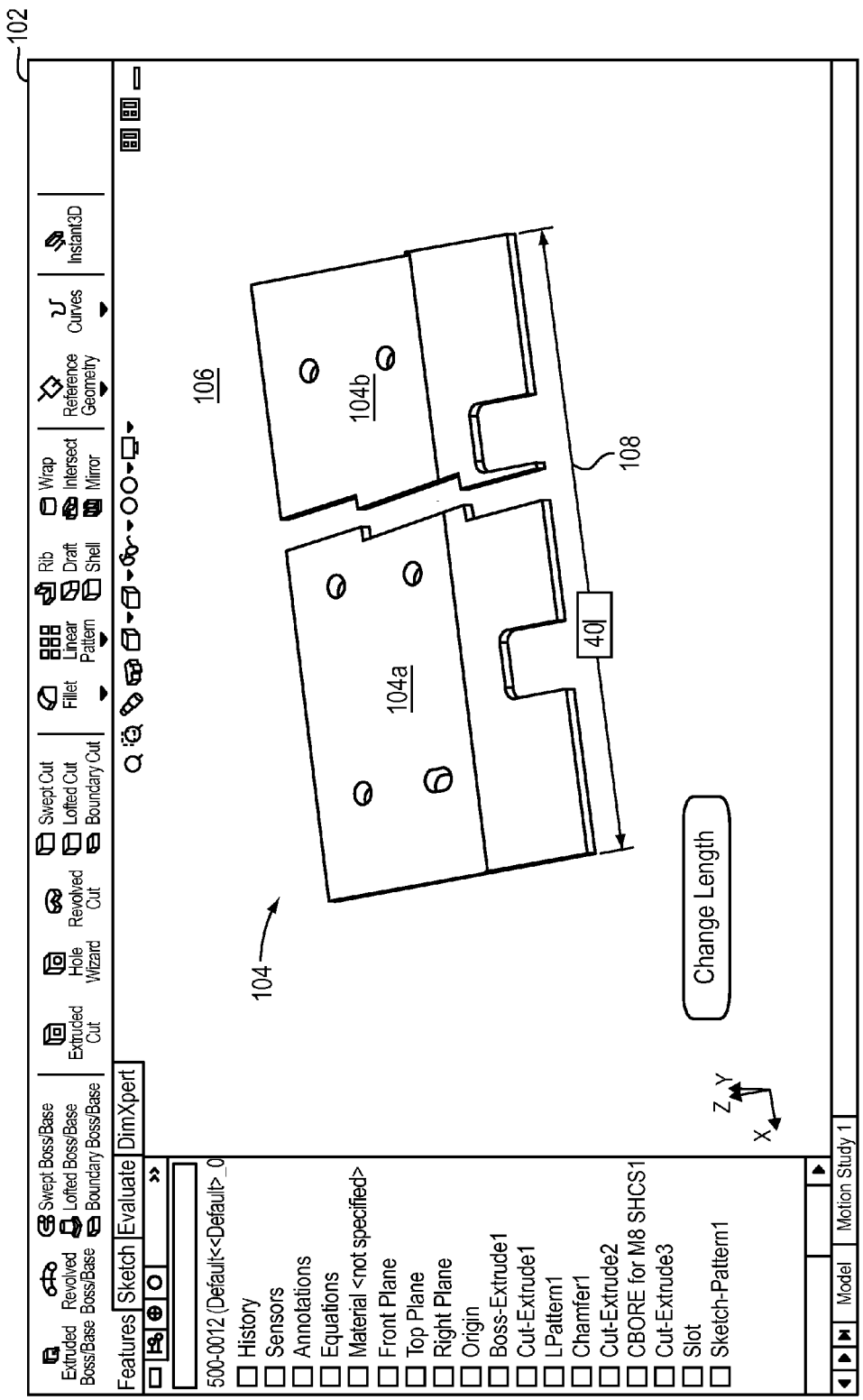
FIG. 6 is an illustration of the broken view of the CAD model in FIG. 1 and a modified dimension, according to an embodiment of the present invention.
Figure 7:
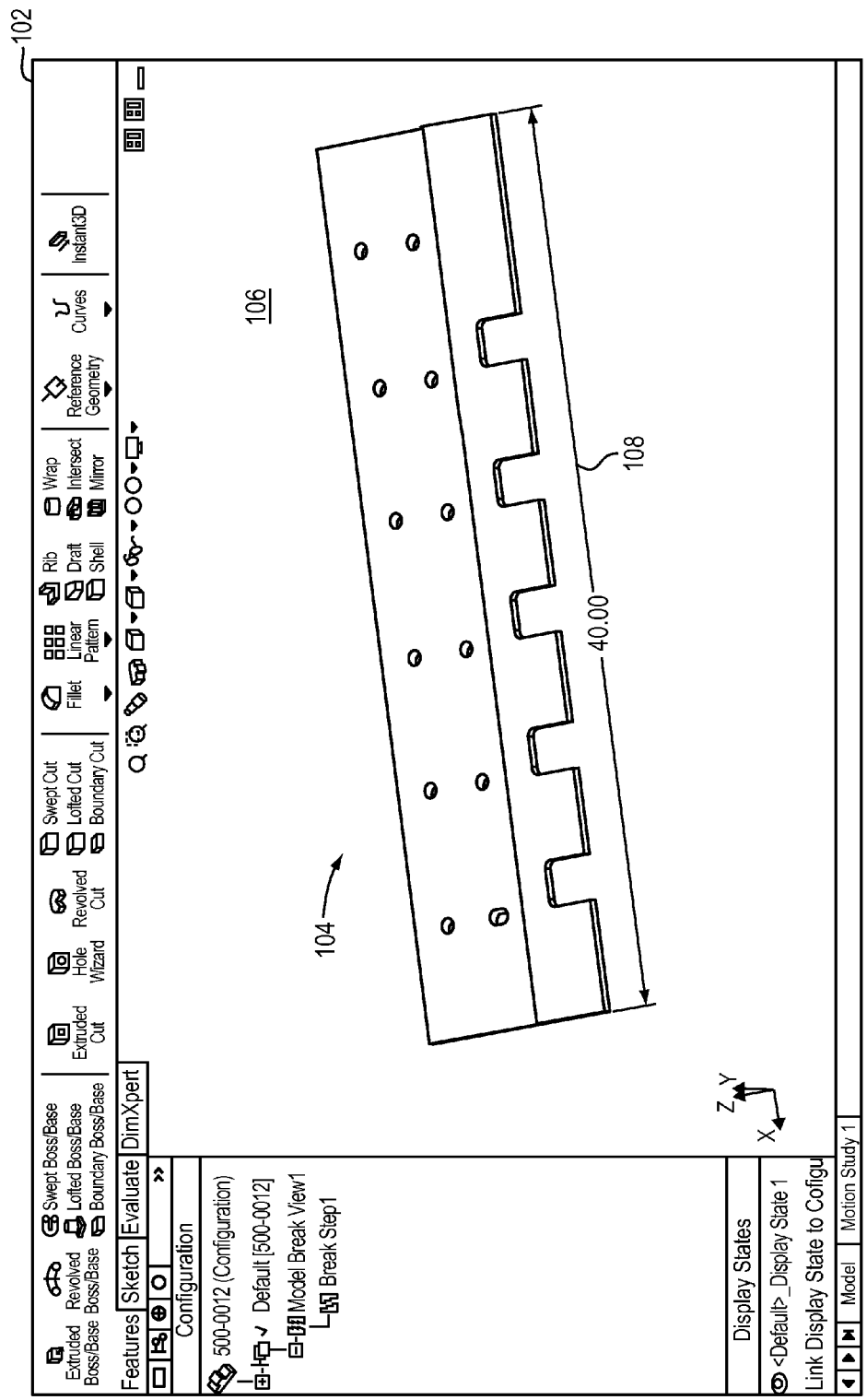
FIG. 7 is an illustration of the unbroken CAD model in FIG. 1 and a modified dimension, according to an embodiment of the present invention.

FIG. 6 and FIG. 7 illustrate a changed value of dimension 108. In FIG. 6, the value of dimension 108 is in the process of being modified from 36 to 40 units in the broken rendering of the 3D model 104. In FIG. 7, the changed value of dimension 108 is automatically maintained in the unbroken 3D model 104 via a mapping between the broken and unbroken data structures of 3D model 104, which later will be discussed.

To create a broken 3D model, a solid body tool is created. Such a tool may begin as a plane and be extruded to a rectangular volume. A Boolean subtraction operation is then applied to subtract the solid body tool from the unbroken 3D model, resulting in a broken 3D model. After the 3D model is broken, the pieces of the 3D model are pushed toward one another equidistantly towards an imaginary plane in the center of the break to reduce the size of the gap between the pieces. Alternatively, a user interface tool may be used to indicate the plane about which the broken pieces are to be displayed, in which case, one broken piece may be moved further in one direction than the other broken piece is moved in the opposite direction.

The style of the break determines which solid body tool to subtract from the 3D model. As discussed, the solid body tool may be a rectangular volume, which involves cutting the 3D model using two planes. To create a jagged cut, as shown in FIGS. 4-6, a jagged profile is extruded to create the solid body tool. For a jagged cut, the depth of the zig-zag pattern is determined by a parameter that has a default value specifying the angles in the pattern, which may be overridden by a user-specified value. A profile is then created according to the ratio of the distance between two consecutive outer or inner zig-zag points and size of the 3D model being cut in a direction perpendicular to the direction of the cut. The user may also create a unique profile, apply an extrude or sweep operation to the profile, and thereby create a customized solid tool body with which to create a break in a 3D model.

Figure 8A:
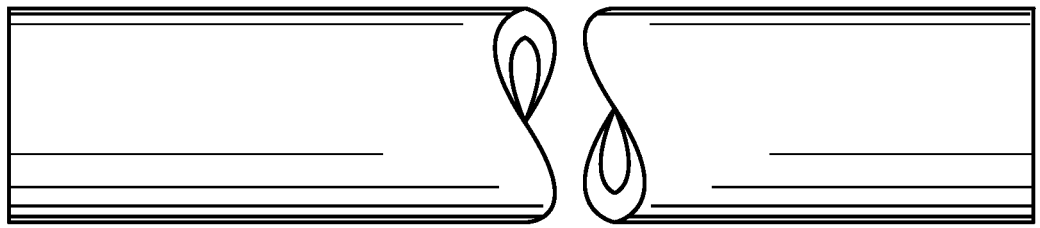
FIG. 8a illustrates a broken model of a pipe, according to an embodiment of the present invention.
Figure 8B:
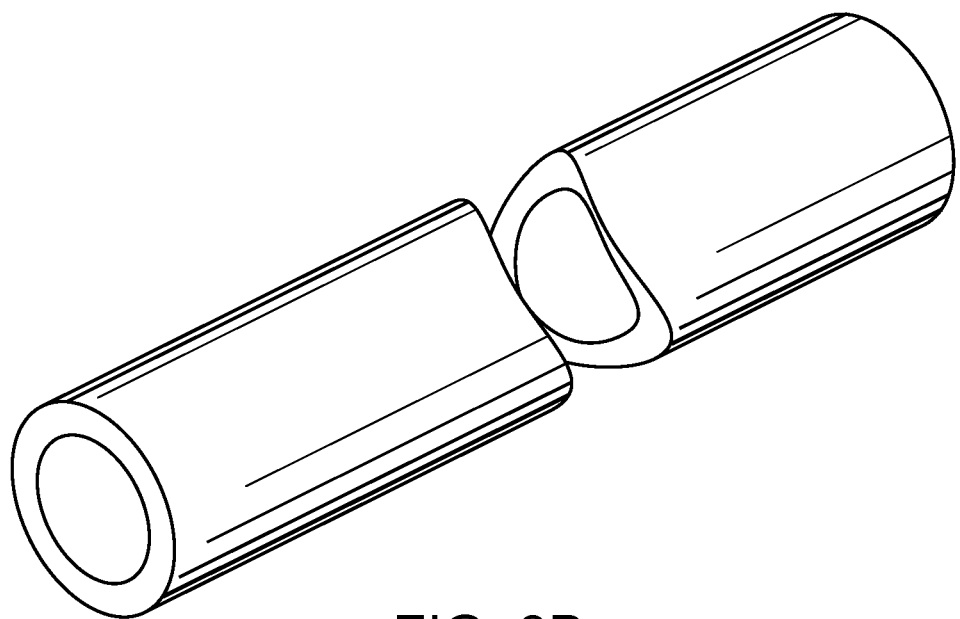
FIG. 8b illustrates a broken model of a pipe, according to an embodiment of the present invention.
Figure 9A:
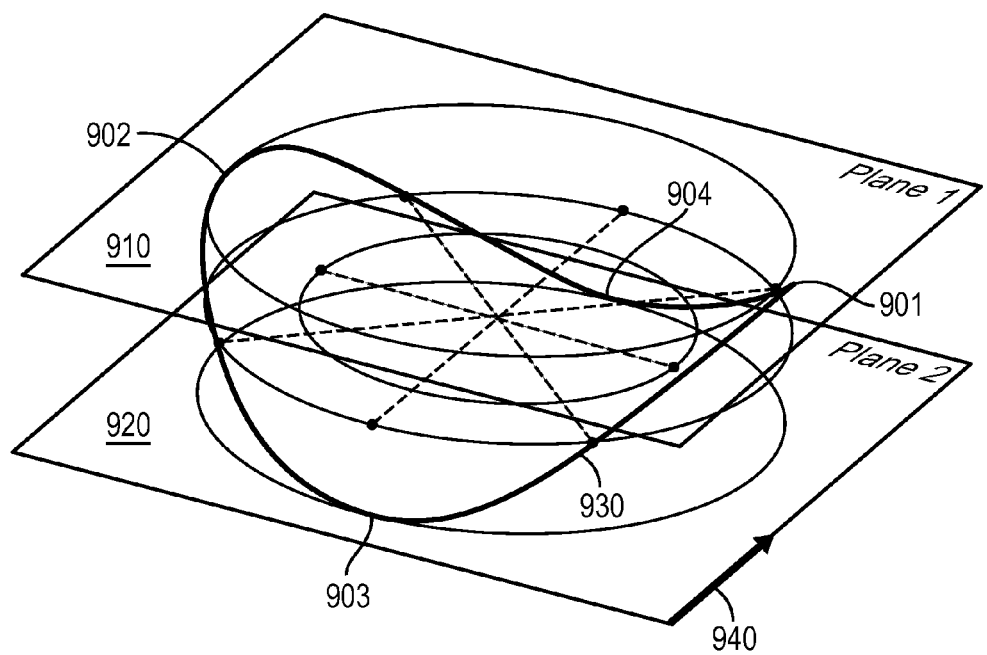
FIGS. 9a, 9b, 9c, and 9d illustrate the creation and application of a saddle-shaped tool.
Figure 9B:
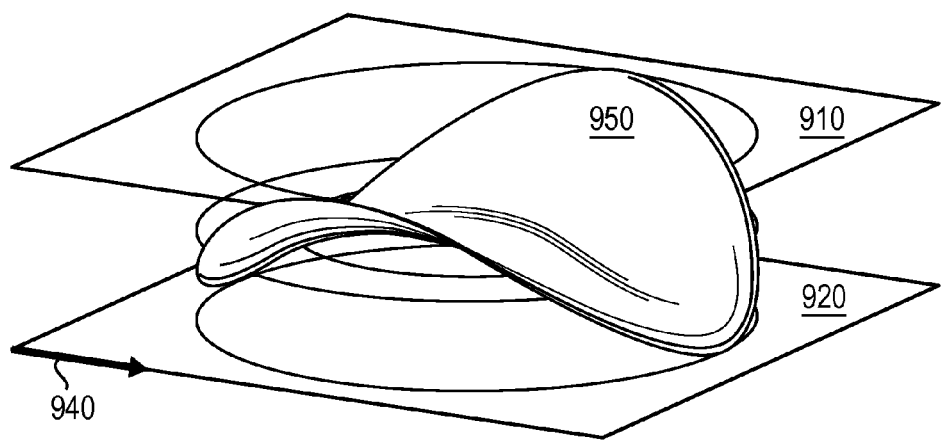
Figure 9C:
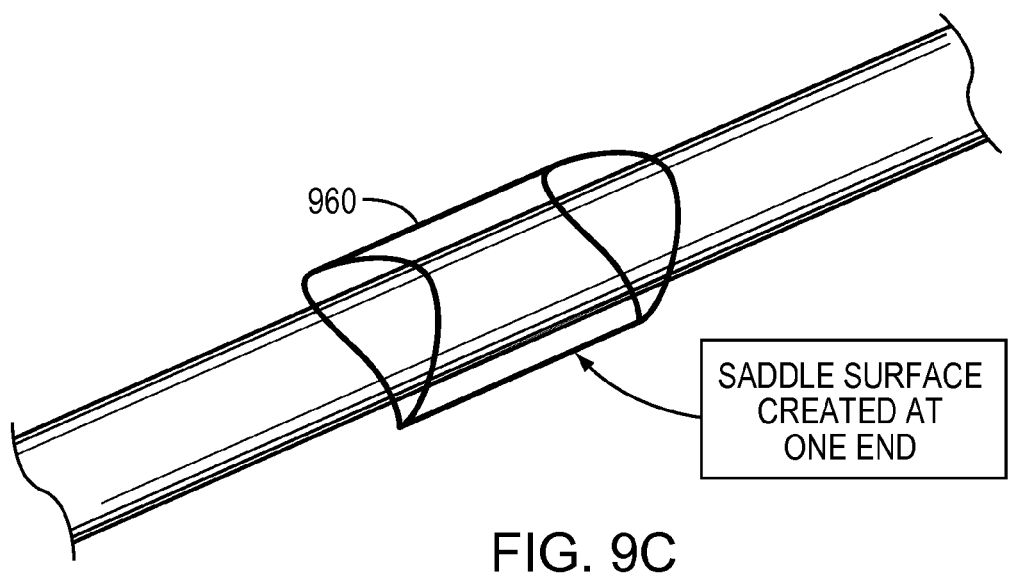
Figure 9D:
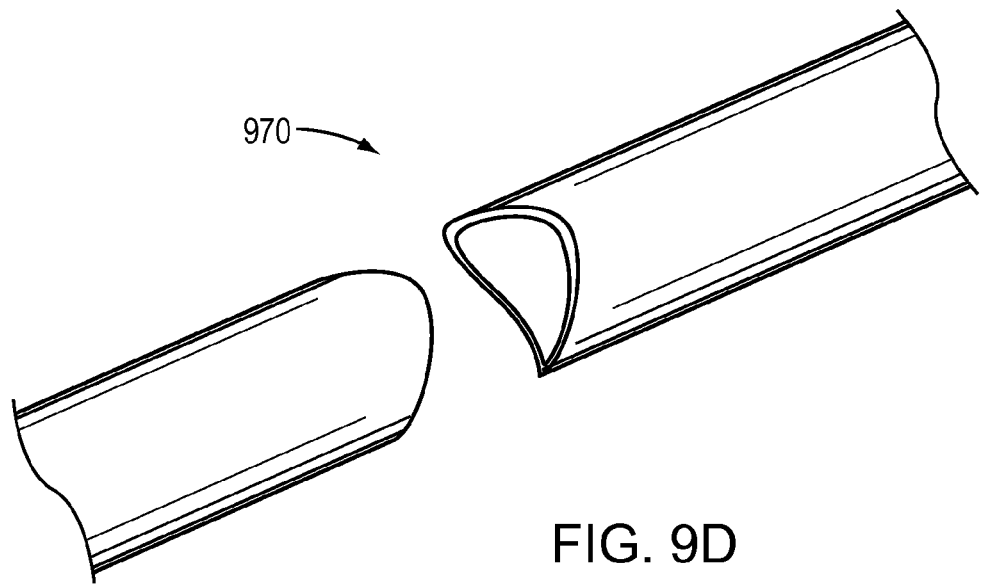

The present invention also provides a solid body tool that creates a break face in the shape of a saddle surface. This saddle-surface style may be referred to as a pipe break because a broken pipe is often depicted as a saddle-shaped break, as shown in FIGS. 8a and 8b. The saddle-surface style cannot be created using a single plane. Therefore, referring now to FIG. 9a, four points 901-904 are created, two points 901, 902 on each one plane 910 and two points 903, 904 on a separate plane 920 aligned in a direction 940. Then, a closed bspline curve 930 is created passing through the four points 901-904. As shown in FIG. 9b, a surface fill operation is executed to create a surface 950, which is extruded along a vector (e.g., the axis of the pipe) to form a volume 960 as illustrated in FIG. 9c. Volume 960 is subtracted from the unbroken 3D model 970 thereby creating a broken 3D model 980, as illustrated in FIG. 9d.

The saddle-surface style volume can also be created by first constructing a circle somewhat bigger than the model of the pipe (or other 3D model) that the user wishes to cut. Four points are arranged on the circle and equally spaced around the circle. Two of the points that are opposite one another are translated some amount upward from the circle, perpendicular to the plane on which the circle lies. A similar operation is performed on the other two points, except these other two points are translated downward from the circle, perpendicular to the plane on which the circle lies. The second two points may be translated downward by the same or a different amount than the first two points were translated upward. The amount that the points are translated is a default amount or a user-specified amount. A closed spline is then fit through the four points, which alternate above and below the circle, to create a smooth curve that is then filled and extruded to create a volume.

A mapping ensures that the data in the data structure defining an unbroken 3D model is synchronized with the data structure defining the 3D model in a broken state. The mapping occurs between faces and edges in a broken 3D model with the same faces and edges in the unbroken 3D model. Such mapping can be accomplished by constructing a data structure that utilizes pointers so that the topological and/or geometric entities in the unbroken 3D model refer to respective topological and/or geometric entities in the broken 3D model, and vice versa. These pointers are bidirectional and may have one-to-many relationships.

Measurements and callouts need to be displayed in the correct place relative to an unbroken model and a respective broken model. To accomplish this, a mapping must occur between certain locations of the broken and unbroken locations. These locations may be the positions of call outs (e.g., a measurement call out, where the locations may be the beginning and end points of the measured entity), with respect to the geometry of the 3D model. Dimensions and annotations also have a number of point locations that must also be transformed from the original 3D model space to the new broken 3D model space.

The present invention allows for multiple breaks, therefore correct mappings may require the model to be processed multiple times. Reverse transformations are applied to map data from the broken model to the unbroken model. Mapping occurs whenever the model is updated. Therefore, whether the 3D model is broken or unbroken the data is accurate.

Since a broken model may contain multiple breaks, pieces of a face or an edge in the unbroken model may become multiple pieces of the respective face or edge in a broken model. When one of these multiple pieces if selected, the present invention highlights all the pieces of the respective face or edge to indicate to the user the full extent of the unbroken (true) model entity.

To facilitate the mapping, in an embodiment, all faces of a 3D model have an attribute that is a tag. In an unbroken 3D model, the tag identifies the face in the unbroken model. In a broken model, the tag identifies the face in the unbroken model from which the face in the broken model was derived. A tag for a face may be created by copying a tag from an unbroken face to the respective broken face when a face becomes broken. Likewise, edges and vertices may be tagged similarly. A mapping is then built using these tags. In this way, original faces, edges, and vertices may be found when needed by a CAD modeling operation or another operation that necessitates the use of topology and/or geometry in the unbroken model, as previously discussed.

Certain operations rely on the topology and/or the geometry or a 3D model, or involve modifying the geometry or topology of a 3D model, and therefore, the respective operation uses geometric and/or topological data from the unbroken model. As discussed dimension and measurement operations use data from an unbroken 3D model to calculate and display a dimension and a measurement, respectively. Other operations that rely on data in an unbroken 3D model include a center of mass operation. When the center of mass operation is executed while viewing a broken 3D model, the reference points falling within a break in the 3D model may or may not be shown or indicated. Operations that edit and add features to a 3D model also involve modifying and/or adding geometry and/or topology entities; editing and adding features may necessitate modifying or adding tags to the unbroken model and establishing a mapping of the updated and/or modified tags between the unbroken and broken 3D models. Additionally, mate operations, which create constraints between geometric and/or topological entities in a model (e.g., concentric, parallel, and tangent constraints), require the use of geometry and/or topology, and therefore, data in the unbroken 3D model is used for mate operations.

In an embodiment, to create and maintain the relationships between the unbroken 3D model and the resultant broken 3D model, the following process is implemented. Prior to cutting an unbroken 3D model to create the broken 3D model, an attribute (i.e., data such as an integer, real number, or string) is attached to every topological entity in the model (which includes faces, edges, vertices, and bodies). Each attribute contains an original tag of the corresponding topological entity, where a tag is a unique numeric identifier for a topological entity. When geometric operations are applied to a model, certain rules regarding attributes are applied. One rule is that when a topological entity is copied, the attributes on that entity are also copied. Another rule is that when an entity is split, the attributes on the original topological entity are copied to all of the resultant topological entities. When the cutting operation (e.g., a Boolean operation) is executed on the unbroken 3D model to create the broken 3D model, the attributes allow for the topology in the broken 3D model to be traced back to the unbroken 3D model. The relationships from the broken 3D model back to the unbroken 3D model are one-to-one, whereas the reverse relationships from the unbroken 3D model to the broken 3D model are one-to-many, because faces, edges, and bodies, may be split. To facilitate high performance in such operations as selecting and highlighting entities, after a modeling operation is performed on a broken 3D model, all the topological entities in the broken 3D model are cycled through and hash tables are created allowing for quick back and forth referencing between the unbroken 3D model topology and the broken 3D model topology.

Figure 10:
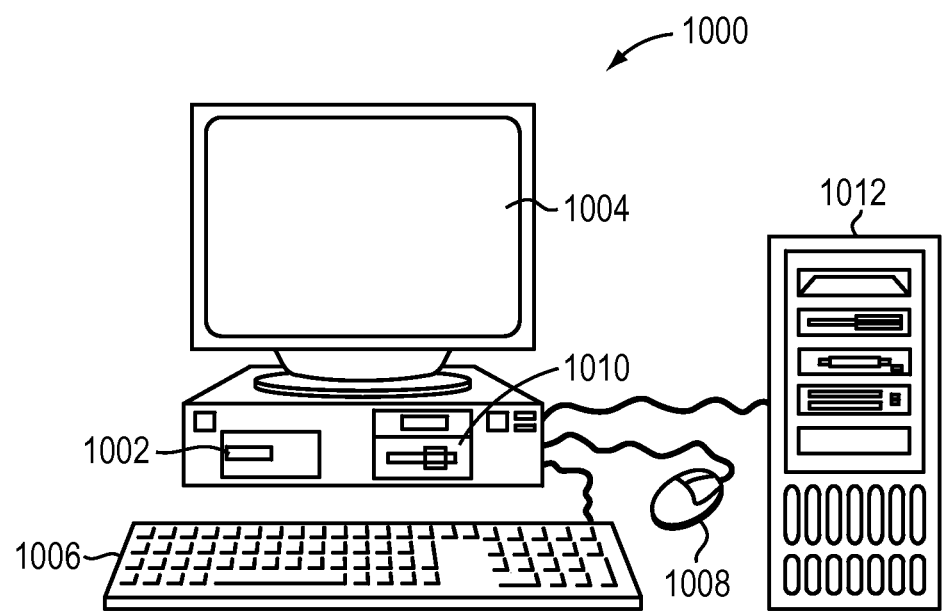
FIG. 10 is an illustration of a computer-aided design system according to an example embodiment of the present invention

Referring now to FIG. 10, an illustration a computerized modeling system 1000 that includes a CPU 1002, a computer monitor 1004, a keyboard input device 1006, a mouse input device 1008, and a storage device 1010. The CPU 1002, computer monitor 1004, keyboard 1006, mouse 1008, and storage device 1010 can include commonly available computer hardware devices. For example, the CPU 1002 can include an Intel-based processor. The mouse 1008 may have conventional left and right buttons that the design engineer may press to issue a command to a software program being executed by the CPU 1002. As an alternative or in addition to the mouse 1008, the computerized modeling system 1000 can include a pointing device such as a trackball, touch-sensitive pad, or pointing device and buttons built into the keyboard 1006. Those of ordinary skill in the art appreciate that the same results described herein with reference to a mouse device can be achieved using another available pointing device. Other appropriate computer hardware platforms are suitable as will become apparent from the discussion that follows. Such computer hardware platforms are preferably capable of operating the Microsoft Windows 7 or Windows 8, UNIX, Linux, or MAC OS operating systems.

Additional computer processing units and hardware devices (e.g., rapid prototyping, video, and printer devices) may be included in the computerized modeling system 1000. Furthermore, the computerized modeling system 1000 may include network hardware and software thereby enabling communication to a hardware platform 1012, and facilitating communication between numerous computer systems that include a CPU and a storage system, among other computer components.

Computer-aided modeling software may be stored on the storage device 1010 and loaded into and executed by the CPU 1002. The modeling software allows a design engineer to create and modify a 3D model and implements aspects of the invention described herein. The CPU 1002 uses the computer monitor 1004 to display a 3D model and other aspects thereof as described. Using the keyboard 1006 and the mouse 1008, the design engineer can enter and modify data associated with the 3D model. The CPU 1002 accepts and processes input from the keyboard 1006 and mouse 1008. The CPU 1002 processes the input along with the data associated with the 3D model and makes corresponding and appropriate changes to that which is displayed on the computer monitor 1004 as commanded by the modeling software. In one embodiment, the modeling software is based on a solid modeling system that may be used to construct a 3D model consisting of one or more solid and surface bodies.

Embodiments of the invention may be implemented in digital electronic circuitry, or in computer hardware, firmware, software, or in combinations thereof. Apparatuses may be implemented in a computer program product tangibly embodied in a machine-readable storage device for execution by a programmable processor; and method steps may be performed by a programmable processor executing a program of instructions to perform functions by operating on input data and generating output. Embodiments of the invention may advantageously be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; in any case, the language may be a compiled or interpreted language. Suitable processors include, by way of non-limiting example, both general and special purpose microprocessors. Generally, a processor will receive instructions and data from a read-only memory and/or a random access memory and in some embodiments instructions and data may be downloaded through a global network. Storage devices suitable for tangibly embodying computer program instructions and data are non-transitory (e.g., a data signal is not suitable) and include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, custom-designed ASICs (application-specific integrated circuits).

Embodiments of the present invention or aspects thereof described herein may be implemented in the form of hardware, firmware, or software. If implemented in software the software may be stored on any non-transient computer readable medium that is configured to enable a processor to load the software or subsets of instructions thereof. The processor then executes the instructions and is configured to operate or cause an apparatus to operate in a manner as described herein.

Although the present invention is described in connection with an exemplary computer system environment, embodiments of the invention are operational with numerous other general purpose or special purpose computer system environments or configurations. The computer system environment is not intended to suggest any limitation as to the scope of use or functionality of any aspect of the invention. Moreover, the computer system environment should not be interpreted as having any dependency or requirement relating to any one or combination of components illustrated in the exemplary operating environment. Examples of computer systems, environments, and/or configurations that may be suitable for use with aspects of the invention include, but are not limited to, personal computers (PCs), server computers, hand-held and laptop devices, multiprocessor systems, microprocessor-based systems, set top boxes, programmable consumer electronics, mobile telephones and mobile operating systems, network PCs, minicomputers, mainframe computers, distributed computing environments that include any of the above systems or devices, and the like. The computer system may have standalone components or workstations, or the computer system may be formed of networked computers by any of known communications networks, processing networks, cloud-based networks, related protocols and the like.

As can be appreciated, the network can be a public network, such as the Internet, or a private network such as an LAN or WAN network, or any combination thereof and can also include PSTN or ISDN sub-networks. The network can also be wired, such as an Ethernet network, or can be wireless such as a cellular network including EDGE, 3G and 4G wireless cellular systems. The wireless network can also be WiFi, Bluetooth, or any other wireless form of communication that is known. Thus, the network is merely exemplary and in no way limits the scope of the present advancements.

The present invention provides numerous advantages. For example, the present invention breaks 3D models and allows for accurate depictions of break views within a 2D drawing, an orthographic projection, and an axonometric projection, including the use of the saddle-shape geometry as an interruption face to demonstrate the break of solid and tubular components, per ASME Y14.3-2003, paragraph 4.6.7 and FIG. 58 and ASME Y14.4M-1989, paragraph 3.2.2 and FIG. 13. A further advantage is that the user interface allows the user to define the extents of the break in the model using a set of 2D planes. Additionally, the geometry of the respective broken faces may be specified by choosing a style and may be modified.

Within the 3D modeling environment, the present invention supports working with various model attributes to more effectively apply modifications to the positioning of components that include elongated features that are not necessary to the modification but otherwise are part of the definition of a model representing a real-world object.

Further advantages include maintaining a relationship between a broken and an unbroken 3D model, which enables operations performed on one representation of the model to automatically be performed on the other representation of the model, and accurately measuring a 3D model when the measurement traverses a break in the model, using a solid body to customize the style of the break. A two-way associativity between the unbroken and broken states of a 3D model enable any change to the 3D model in either state to be reflected in the other state.

A number of embodiments of the present invention have been described. Nevertheless, it will be understood that various modifications may be made without departing from the spirit and scope of the invention. Furthermore, implementations may change the order in which operations are performed. Furthermore, depending on the needs of an implementation, particular operations described herein may be implemented as a combined, eliminated, added to, or otherwise rearranged.

What is claimed is:

1. A computer-implemented method of computer-aided design (CAD) comprising:
   creating a computer-generated three-dimensional (3D) model in a broken view state, by:
   removing an area of the computer-generated 3D model in an unbroken view state to create the computer-generated 3D model in the broken view state;
   implementing a mapping between the computer-generated 3D model in the unbroken view state and the computer-generated 3D model in the broken view state to enable operations performed on the computer-generated 3D model in the broken view state to utilize data defining the computer-generated 3D model in the unbroken view state, wherein the mapping maintains a relationship between data defining the computer-generated 3D model in the unbroken view state and data defining the computer-generated 3D model in the broken view state;
   identifying entities in the computer-generated 3D model in the unbroken view state using identifying data, wherein each identified entity is one of a topological entity and a geometric entity;
   constructing one or more data structures to hold the data defining the computer-generated 3D model in the unbroken view state and to hold the data defining the computer-generated 3D model in the broken view state; and
   utilizing the identifying data and the mapping to determine from which identified entity in the computer-generated 3D model in the unbroken view state an entity in the computer-generated 3D model in the broken view state is derived, results of the determination enabling an operation performed on the computer-generated 3D model in the broken view state to access from the data structures and use data defining the computer-generated 3D model in the unbroken view state.

2. The computer-implemented method of claim 1, wherein:
   if a change is made to the computer-generated 3D model in the broken view state, the computer-generated 3D model in the unbroken view state is updated to reflect the change, and
   if a modification is made to the computer-generated 3D model in the unbroken view state, the computer-generated 3D model in the broken view state is updated to reflect the modification.

3. The computer-implemented method of claim 1, wherein the identifying data are a set of pointers between the identified entities in the computer-generated 3D model in the unbroken view state and respective derived entities in the computer-generated 3D model in the broken view state.

4. The computer-implemented method of claim 1, wherein the mapping forms a relationship between each identified entity in the computer-generated 3D model in the unbroken view state and a respective derived entity in the computer-generated 3D model in the broken view state.

5. The computer-implemented method of claim 1, wherein the operation performed outputs one of a dimension and a measurement on a computer screen.

6. The computer-implemented method of claim 1, further comprising:
   utilizing the identifying data to determine a first location associated with the computer-generated 3D model in the unbroken view state; and computing a second location in the computer-generated 3D model in the broken view state to display an annotation.

7. The computer-implemented method of claim 1, wherein removing the area of the computer-generated 3D model in the unbroken view state comprises:
  specifying the area of the computer-generated 3D model in the unbroken view state to remove;
  constructing a volume a size of the area; and
  using a Boolean operation, subtracting the volume from the computer-generated 3D model in the unbroken view state to create the computer-generated 3D model in the broken view.

8. The computer-implemented method of claim 7, wherein the volume is constructed from one of an extruded plane, an extruded profile, and a swept profile.

9. The computer-implemented method of claim 7, wherein the volume is constructed by extruding one of a saddle-shaped surface and a zig-zag pattern surface.

10. A computer-aided design system comprising:
  a processor operatively coupled to a data storage system, the data storage system storing a three-dimensional model; and
  a data storage memory operatively coupled to the processor and comprising instructions to configure the processor to:
    remove an area of a three-dimensional (3D) model in an unbroken view state to create the 3D model in a broken view state;
    create a mapping between the 3D model in the unbroken view state and the 3D model in the broken view state to enable operations performed on the 3D model in the broken view state to utilize data defining the 3D model in the unbroken view state, wherein the mapping maintains a relationship between data defining the 3D model in the unbroken view state and data defining the 3D model in the broken view state;
    identify entities in the 3D model in the unbroken view state using identifying data, wherein each identified entity is one of a topological entity and a geometric entity;
    construct one or more data structures holding data defining the 3D model in the unbroken view state and data defining the 3D model in the broken view state; and
    utilize the identifying data and the mapping to determine from which identified entity in the 3D model in the unbroken view state an entity in the 3D model in the broken view state is derived, results of the determination enabling an operation performed on the 3D model in the broken view state to use data defining the 3D model in the unbroken view state.

11. The computer-aided design system of claim 10, wherein:
  if a change is made to the 3D model in the broken view state, the 3D model in the unbroken view state is updated to reflect the change, and
  if a modification is made to the 3D model in the unbroken view state, the 3D model in the broken view state is updated to reflect the modification.

12. The computer-aided design system of claim 10, wherein the mapping forms a relationship between each identified entity in the 3D model in the unbroken view state and a respective derived entity in the 3D model in the broken view state.

13. The computer-aided design system of claim 10, further comprising instructions to configure the processor to:
  utilize the identifying data to determine a first location associated with the 3D model in the unbroken view state; and
  compute a second location in the 3D model in the broken view state to display an annotation.

14. The computer-aided design system of claim 10, wherein instructions to configure the processor to remove the area of the 3D model in the unbroken view state further comprises instructions to configure the processor to:
  indicate the area of the computer-generated 3D model in the unbroken view state to remove;
  construct a volume a size of the area; and
  perform a Boolean operation to subtract the volume from the 3D model in the unbroken view state to create the 3D model in the broken view state.

15. A non-transitory computer-readable data storage medium comprising:
  a memory area holding instructions supporting computer-aided design, the instructions causing a computer to:
    remove an area of a three-dimensional (3D) model in an unbroken view state to create the 3D model in a broken view state;
    create a mapping between the 3D model in the unbroken view state and the 3D model in a broken view state to enable operations performed on the 3D model in the broken view state to utilize data defining the 3D model in the unbroken view state, wherein the mapping maintains a relationship between data defining the 3D model in the unbroken view state and data defining the 3D model in the broken view state;
    identify entities in the 3D model in the unbroken view state using identifying data, wherein each identified entity is one of a topological entity and a geometric entity;
    construct one or more data structures holding data defining the 3D model in the unbroken view state and data defining the 3D model in the broken view state; and
    utilize the identifying data to determine from which identified entity in the 3D model in the unbroken view state an entity in the 3D model in the broken view state is derived, results of the determination enabling an operation performed on the 3D model in the broken view state to use data defining the 3D model in the unbroken view state.

16. The non-transitory computer-readable data storage medium of claim 15, wherein:
  if a change is made to the 3D model in the broken view state, the 3D model in the unbroken view state is updated to reflect the change, and
  if a modification is made to the 3D model in the unbroken view state, the 3D model in the broken view state is updated to reflect the modification.

17. The non-transitory computer-readable data storage medium of claim 15, wherein the mapping forms a relationship between each identified entity in the 3D model in the unbroken view state and a respective derived entity in the 3D model in the broken view state.

18. The non-transitory computer-readable data storage medium of claim 15, further comprising instructions to configure the processor to:
  utilize the identifying data to determine a first location associated with the 3D model in the unbroken view state; and
  compute a second location in the 3D model in the broken view state to display an annotation.

19. The non-transitory computer-readable data storage medium of claim 15, wherein instructions to configure the processor to remove the area of the 3D model in the unbroken view state further comprises instructions to configure the processor to:
- indicate the area of the computer-generated 3D model in the unbroken view state to remove;
- construct a volume a size of the area; and
- perform a Boolean operation to subtract the volume from the 3D model in the unbroken view state to create the 3D model in the broken view state.

\* \* \* \* \*